(12) United States Patent
Ranish et al.

(10) Patent No.: US 10,053,777 B2
(45) Date of Patent: Aug. 21, 2018

(54) THERMAL PROCESSING CHAMBER

(71) Applicant: Applied Materials, Inc., Santa Clara, CA (US)

(72) Inventors: Joseph M. Ranish, San Jose, CA (US); Aaron Muir Hunter, Santa Cruz, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 502 days.

(21) Appl. No.: 14/219,644

(22) Filed: Mar. 19, 2014

(65) Prior Publication Data

US 2015/0267300 A1    Sep. 24, 2015

(51) Int. Cl.
| | | |
|---|---|---|
| *C23C 16/52* | (2006.01) | |
| *C23C 16/46* | (2006.01) | |
| *C23C 16/44* | (2006.01) | |
| *C23C 16/48* | (2006.01) | |
| *C23C 16/458* | (2006.01) | |

(52) U.S. Cl.
CPC ......... *C23C 16/46* (2013.01); *C23C 16/4584* (2013.01); *C23C 16/4585* (2013.01); *C23C 16/483* (2013.01); *C23C 16/4411* (2013.01); *C23C 16/48* (2013.01); *C23C 16/481* (2013.01); *C23C 16/482* (2013.01); *C23C 16/488* (2013.01)

(58) Field of Classification Search
None
See application file for complete search history.

(56) References Cited

U.S. PATENT DOCUMENTS

| | | | | |
|---|---|---|---|---|
| 5,790,750 | A * | 8/1998 | Anderson | ............ C23C 16/481 118/725 |
| 6,108,491 | A * | 8/2000 | Anderson | ......... H01L 21/67115 118/725 |
| 6,153,260 | A * | 11/2000 | Comita | ............... C23C 16/4408 118/719 |
| 6,222,990 | B1 * | 4/2001 | Guardado | ............... C30B 25/10 118/724 |
| 7,453,051 | B2 | 11/2008 | Timans | |
| 8,150,242 | B2 * | 4/2012 | Merry | .................. C23C 16/481 392/407 |
| 8,288,685 | B2 | 10/2012 | Jennings et al. | |

(Continued)

FOREIGN PATENT DOCUMENTS

KR    2011-0044698 A    4/2011

OTHER PUBLICATIONS

PCT Notification of Transmittal of the International Search Report and the Written Opinion of the International Searching Authority for International Application No. PCT/US2015/019829 dated Jun. 24, 2015; 11 total pages.

*Primary Examiner* — Sylvia Macarthur
(74) *Attorney, Agent, or Firm* — Patterson + Sheridan LLP

(57) ABSTRACT

Embodiments described herein provide a substrate processing apparatus that includes a vacuum chamber comprising a first dome and a second dome, a substrate support disposed inside the vacuum chamber between the first and second domes, a collimated energy source arranged in a compartmented housing and positioned proximate the second dome, wherein the second dome is between the collimated energy source and the substrate support. At least a portion of the second dome and the substrate support may be optically transparent to the collimated energy from the collimated energy source.

19 Claims, 9 Drawing Sheets

(56) References Cited

U.S. PATENT DOCUMENTS

| | | | |
|---|---|---|---|
| 8,372,667 B2 | 2/2013 | Moffatt | |
| 9,842,753 B2* | 12/2017 | Brillhart | H01L 21/67115 |
| 2003/0185965 A1* | 10/2003 | Lin | C23C 4/12 |
| | | | 427/8 |
| 2008/0210163 A1* | 9/2008 | Carlson | C23C 16/22 |
| | | | 118/715 |
| 2008/0257263 A1* | 10/2008 | Pavloff | C22C 21/00 |
| | | | 118/723 R |
| 2009/0260982 A1* | 10/2009 | Riker | C23C 14/34 |
| | | | 204/298.11 |
| 2009/0276097 A1 | 11/2009 | Patalay et al. | |
| 2010/0143579 A1* | 6/2010 | Narahara | C23C 16/4583 |
| | | | 427/8 |
| 2012/0052216 A1 | 3/2012 | Hanawa et al. | |
| 2012/0067894 A1 | 3/2012 | Graells Ferrandez et al. | |
| 2012/0108081 A1 | 5/2012 | Olgado et al. | |
| 2012/0273005 A1* | 11/2012 | Ramachandran | H01L 21/67253 |
| | | | 134/18 |
| 2013/0193132 A1 | 8/2013 | Serebryanov et al. | |
| 2013/0284095 A1* | 10/2013 | Ranish | H01L 21/02104 |
| | | | 118/725 |
| 2013/0287377 A1 | 10/2013 | Serebryanov et al. | |
| 2013/0298832 A1 | 11/2013 | Ranish et al. | |
| 2013/0323936 A1 | 12/2013 | Ranish et al. | |
| 2014/0319120 A1* | 10/2014 | Brillhart | H01L 21/67115 |
| | | | 219/405 |
| 2015/0233016 A1* | 8/2015 | Brillhart | C30B 25/14 |
| | | | 118/724 |
| 2015/0267300 A1* | 9/2015 | Ranish | C23C 16/483 |
| | | | 118/724 |

\* cited by examiner

THERMAL PROCESSING CHAMBER

BACKGROUND

Field of the Invention

An apparatus for semiconductor processing is disclosed herein. More specifically, embodiments disclosed herein relate to an apparatus for heating a substrate in a deposition process.

Description of the Related Art

In the fabrication of integrated circuits, deposition processes such as chemical vapor deposition (CVD) or epitaxy processes are used to deposit films of various materials upon semiconductor substrates. Epitaxy is a process that is used extensively in semiconductor processing to form very thin material layers on semiconductor substrates. These layers frequently define some of the smallest features of a semiconductor device, and they may have a high quality crystal structure if the electrical properties of crystalline materials are desired. A deposition precursor is normally provided to a processing chamber in which a substrate is disposed, the substrate is heated to a temperature that favors growth of a material layer having desired properties.

It is usually desired that the layers have very uniform thickness, composition, and structure. Because of variations in local substrate temperature, gas flows, and precursor concentrations, it is quite challenging to form layers having uniform and repeatable properties. The processing chamber is normally a vessel capable of maintaining high vacuum, typically below 10 Torr, and heat is normally provided by non-collimated sources, such as heat lamps, positioned outside the vessel to avoid introducing contaminants. Control of substrate temperature, and therefore of local layer formation conditions, is complicated by the highly diffusive thermal energy from the heat lamps, thermal absorptions and emissions of chamber components and exposure of sensors and chamber surfaces to layer forming conditions inside the processing chamber. There remains a need for a deposition chamber with improved temperature control.

SUMMARY

Embodiments described herein provide a substrate processing apparatus that includes a vacuum chamber comprising a first dome and a second dome facing the first dome, a substrate support disposed inside the vacuum chamber between the first and second domes, a collimated energy source arranged in a compartmented housing and positioned proximate the second dome, wherein the second dome is between the collimated energy source and the substrate support. At least a portion of the second dome and the substrate support may be optically transparent to the collimated energy from the collimated energy source.

In one embodiment, a substrate processing apparatus is disclosed. The substrate processing apparatus includes a vacuum chamber including a first dome and a second dome, a substrate support disposed inside the vacuum chamber between the first dome and the second dome and facing the first dome, wherein the substrate support is configured to support a substrate having a deposition surface, and a collimated energy source in a compartmented housing positioned proximate the second dome of the vacuum chamber, wherein at least a portion of the second dome and the substrate support are optically transparent to collimated energy from the collimated energy source.

In another embodiment, a substrate processing apparatus is disclosed. The substrate processing apparatus includes a vacuum chamber including a first dome and a second dome, a substrate support disposed inside the vacuum chamber between the first dome and the second dome and facing the first dome, wherein the substrate support is configured to support a substrate having a deposition surface, a collimated energy source in a compartmented housing positioned proximate the second dome of the vacuum chamber, and a metal member disposed between the second dome of the vacuum chamber and the collimated energy source.

In another embodiment, a substrate processing apparatus is disclosed. The substrate processing apparatus includes a vacuum chamber including a first dome and a second dome, a substrate support disposed inside the vacuum chamber between the first dome and the second dome and facing the first dome, wherein the substrate support is configured to support a substrate having a deposition surface, a collimated energy source in a compartmented housing positioned proximate the second dome of the vacuum chamber, and a reflector disposed between the collimated energy source and the second dome.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one implementation may be beneficially used on other implementations without specific recitation.

DETAILED DESCRIPTION

A process chamber capable of zoned temperature control of a substrate while performing a deposition process has a first dome, a side portion, and a second dome all made of a material having the capability to maintain its shape when high vacuum is established within the vessel. A substrate is disposed on a substrate support inside the processing chamber and above the second dome. A collimated energy source may be disposed in a compartmented housing proximate to the second dome, and the second dome may be positioned between the collimated energy source and the substrate support. At least a portion of the second dome and the substrate support may be optically transparent or transmissive to the collimated energy from the collimated energy source.

Figure 1A:
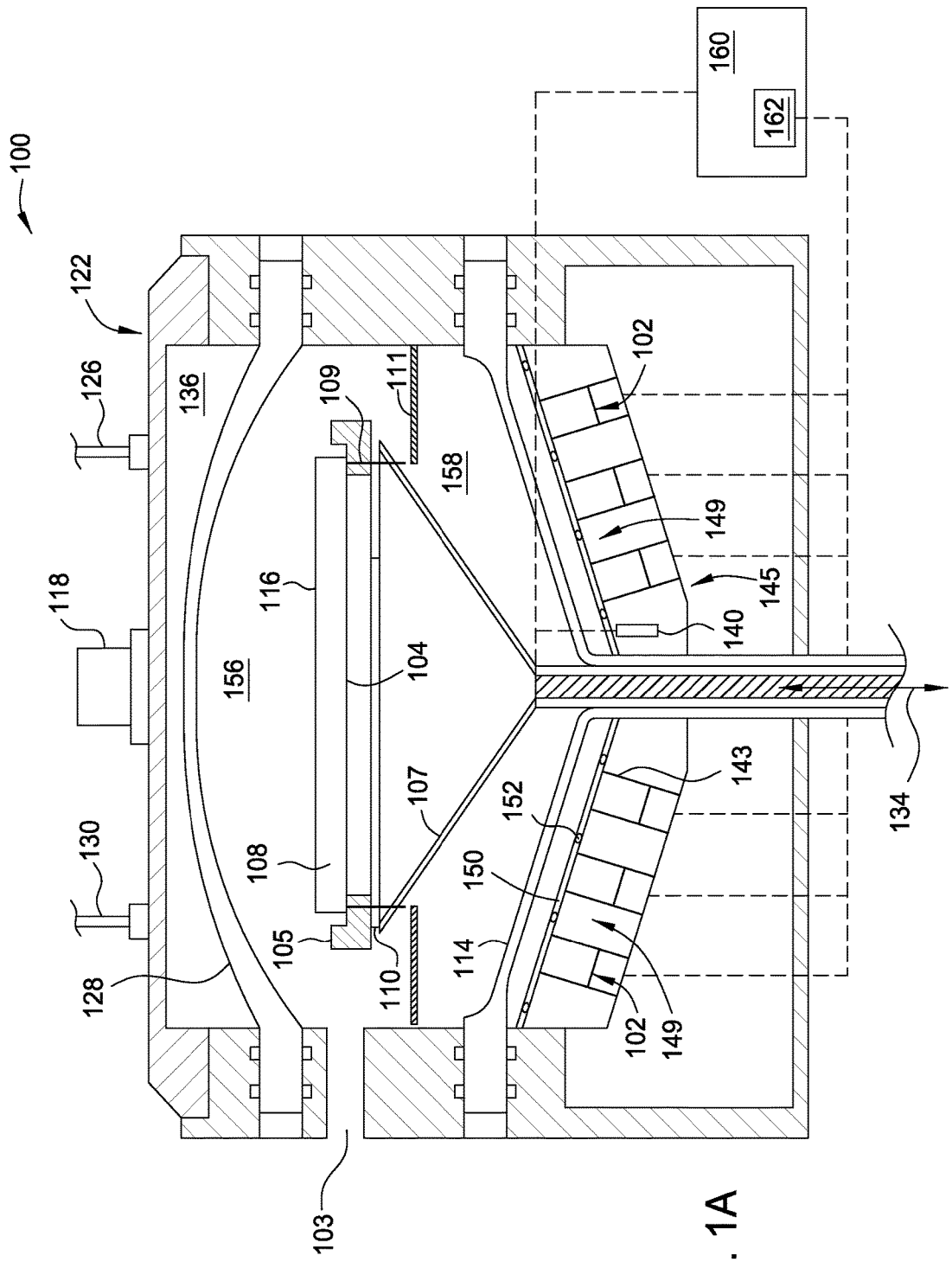
FIGS. 1A-1D are schematic cross-sectional views of a process chamber according to various embodiments described herein.

FIG. 1A is a schematic cross-sectional view of a process chamber 100 according to one embodiment. The process chamber 100 may be used to process one or more substrates, including the deposition of a material on a deposition surface 116 of a substrate 108. The process chamber 100 includes a collimated energy source 102 for heating, among other components, a back side 104 of the substrate 108 disposed within the process chamber 100. The collimated energy source 102 may be a plurality of lasers such as laser diodes, fiber lasers, fiber coupled lasers, or a plurality of light emitting diodes (LEDs). The benefit of having collimated energy delivered to the substrate 108 is to improve control of radiation pattern even when the source 102 is not proximate to the substrate 108. The collimated energy source 102 emits energy with a known divergence. The degree of divergence of the collimated energy source 102 may be less than about 15 degrees full-width at half-maximum (FWHM). Radiation with a known divergence can be controlled using optics that efficiently deliver the radiation to a selected area of a selected image plane, such as the substrate 108. The substrate support 107 may be a funnel-like substrate support, which may support an edge ring 105. The edge ring 105 supports the substrate 108 from the edge of the substrate 108. A plurality of pins 110 may be disposed on the substrate support 107, and the edge ring 105 may be supported by the pins 110. In one embodiment, there are three pins 110. In one embodiment, the edge ring 105 is not present and the substrate 108 is supported by the plurality of pins 110. The substrate support 107 may be made of a material that is optically transmissive or transparent to the collimated energy from the collimated energy source 102, so the collimated energy, such as a plurality of laser beams, from the collimated energy source 102 would heat the back side 104 of the substrate 108 without losing energy. The material for the substrate support 107 may depend on the collimated energy source 102. In one embodiment, the substrate support 107 is made of quartz that is optically transparent to the collimated energy from the collimated energy source 102. Optically transparent means that the material transmits most of the radiation and very little is reflected and/or absorbed. In one embodiment, the substrate support 107 includes optical features or optical elements that direct the collimated energy to the back side 104 of the substrate 108.

The substrate support 107 is shown in an elevated processing position, but may be vertically traversed by an actuator (not shown) to a loading position below the processing position to allow lift pins 109 to contact a ledge or protrusion 111, pass through holes in the substrate support 107, and raise the substrate 108 from the substrate support 107. A robot (not shown) may then enter the process chamber 100 to engage and remove the substrate 108 though the loading port 103. The substrate support 107 then may be actuated to the processing position to place the substrate 108 on the pins 110, with its device side 116 facing away from the back surface 104.

The substrate support 107 is located within the process chamber 100 between a first dome 128 and a second dome 114. The substrate 108 (not to scale) can be brought into the process chamber 100 and positioned onto the substrate support 107 through a loading port 103. The substrate support 107, while located in the processing position, divides the internal volume of the process chamber 100 into a process gas region 156 (above the substrate) and a purge gas region 158 (below the substrate support 107). The substrate support 107 may be rotated during processing by a central shaft 132 to minimize the effect of thermal and process gas flow spatial anomalies within the process chamber 100 and thus facilitate uniform processing of the substrate 108. The substrate support 107 is supported by the central shaft 132, which moves the substrate 108 in an axial direction 134 during loading and unloading, and in some instances, during processing of the substrate 108. The substrate support 107 is typically formed from a material having low thermal mass or low heat capacity, so that energy absorbed and emitted by the substrate support 107 is minimized.

In general, the first dome 128 and the second dome 114 are formed from an optically transparent material such as quartz. The first dome 128 and the second dome 114 are thin to minimize thermal memory, typically having a thickness between about 3 mm and about 10 mm, for example about 4 mm. The first dome 128 may be thermally controlled by introducing a thermal control fluid, such as a cooling gas, through an inlet portal 126 into a thermal control space 136, and withdrawing the thermal control fluid through an exit portal 130. In some embodiments, a cooling fluid circulating through the thermal control space 136 may reduce deposition on an inner surface of the first dome 128. The second dome 114, when it is made of thin quartz, may have a conical shape in order to withstand the vacuum condition inside the processing chamber 100. In one embodiment, the entire second dome 114 is made of quartz, which is optically transparent to the collimated energy from the collimated energy source 102.

A reflector 122 may be optionally placed outside the first dome 128 to reflect radiation that is radiating from the substrate 108 back onto the substrate 108. Due to the reflected radiation, the efficiency of the heating will be improved by containing heat that could otherwise escape the process chamber 100. The reflector 122 can be made of a metal such as aluminum or stainless steel. The reflector 122 can have machined channels 126 to carry a flow of a fluid such as water for cooling the reflector 122. If desired, the efficiency of the reflection can be improved by coating a reflector area with a highly reflective coating such as with gold.

The collimated energy source 102, such as an array of lasers, can be disposed beneath the second dome 114 in a specified manner around the central shaft 132 to heat the substrate 108 as the process gas passes over the substrate 108, thereby facilitating the deposition of a material onto the deposition surface 116 of the substrate 108. In various examples, the material deposited onto the substrate 108 may be a group III, group IV, and/or group V material, or may be a material including a group III, group IV, and/or group V dopant. For example, the deposited material may include silicon, germanium, gallium arsenide, indium gallium arsenide, gallium nitride, indium gallium nitride, aluminum gallium nitride, or another compound semiconductor or semiconductor alloy. The collimated energy source 102 produces collimated radiation, which is useful in creating multiple and spatially smaller zones of control on the substrate 108. As a result, better temperature control of the substrate 108 is achieved.

The collimated energy source 102 may be adapted to heat the substrate 108 to a temperature within a range of about 200 degrees Celsius to about 1400 degrees Celsius, such as about 300 degrees Celsius to about 1350 degrees Celsius. Each energy emitter of the collimated energy source 102 is coupled to a power distribution board (not shown) through which power is supplied to each emitter. The emitters, which may be lasers, are positioned within a compartmented housing 145 which may or may not be cooled during or after processing by, for example, a cooling fluid introduced into channels 149 located between the emitters. Each emitter may be disposed inside a tubing or fiber 143. The emitters may be laser diodes, fiber lasers or fiber coupled lasers. Each emitter is typically supported in the center of the tube 143 for uniform irradiation. In one embodiment, each emitter may be located at the bottom of the tube 143, for example inserted through an opening in the bottom of the tube 143 and secured to, or resting on, the bottom of the tube 143. In another embodiment, each emitter may be supported above the bottom of the tube 143 by a support (not shown), which may be a pin or a protrusion. The support may include a conduit for providing power to the emitter disposed on the support. In one embodiment, a fiber laser may be disposed in a tube such that the emitting end of the fiber laser is positioned near a center of the housing tube spaced apart from the bottom of the housing tube.

A plurality of thermal radiation sensors 140, which may be pyrometers, may be disposed in the housing 145 for measuring thermal emissions of the substrate 108. The sensors 140 are typically disposed at different locations in the housing 145 to facilitate viewing different locations of the substrate 108 during processing. Sensing thermal radiation from different locations of the substrate 108 facilitates comparing the thermal energy content, for example the temperature, at different locations of the substrate 108 to determine whether temperature anomalies or non-uniformities are present. Such non-uniformities can result in non-uniformities in film formation, such as thickness and composition. At least two sensors 140 are typically used, but more than two may be used. Different embodiments may use three, four, five, six, seven, or more sensors 140.

Because the collimated energy source 102 typically produces monochromatic light, the sensors 140 may be attuned to a wavelength that is different from the wavelength of the monochromatic light of the collimated energy source 102, so more accurate temperature reading can be achieved. With broad spectrum energy sources, such as heat lamps, the radiation from the energy source is not monochromatic and may affect the temperature reading of the sensors 140.

A first thermal sensor 118 may be disposed in the reflector 122 to monitor a thermal state of the first dome 128, if desired, or to monitor the thermal state of the substrate 108 from a viewpoint opposite that of the sensors 140. Such monitoring may be useful to compare to data received from the sensors 140, for example to determine whether a fault exists in the data received from the sensors 140. The first thermal sensor 118 may be an assembly of sensors in some cases, featuring more than one individual sensor. Thus, the chamber 100 may feature one or more sensors disposed to receive radiation emitted from a first side of a substrate and one or more sensors disposed to receive radiation from a second side of the substrate opposite the first side.

A controller 160 receives data from the sensors 140 and separately adjusts power delivered to each emitter of the collimated energy source 102, or individual groups of emitters, based on the data. The controller 160 may include a power supply 162 that independently powers the various emitters. The controller 160 can be configured with a desired temperature profile, and based on comparing the data received from the sensors 140, the controller 160 adjusts power to emitters to conform the observed thermal data to the desired temperature profile. The controller 160 may also adjust power to the emitters to conform the thermal treatment of one substrate to the thermal treatment of another substrate, in the event chamber performance drifts over time.

A metal member 150 may be disposed between the second dome 114 and the collimated energy source 102. The metal member 150 may include a cooling channel 152 for controlling the temperature of the second dome 114. Because some processing gases may be present in the purge gas region 158, deposition on the second dome 114 may occur when the temperature of the second dome 114 is too cold or too hot. In addition, the heated substrate 108 may heat the second dome 114, and the heated second dome 114 may take longer to cool than the substrate 108, which in turn may increase the cooling time of the substrate 108. Thus the second dome 114 may be advantageously cooled by the metal member 150 to decrease the cooling time of the substrate 108. As shown in FIG. 1A, the metal member 150 may be conformal to the conical shape of the second dome 114 to provide efficient thermal coupling of the metal member 150 to the second dome 114. The collimated energy source 102, such as a plurality of laser diodes, may form a plane that is substantially conformal to the member 150, as shown in FIG. 1A. Alternatively, the collimated energy source 102 may form a plane that is substantially parallel to the deposition surface 116 of the substrate 108. Optionally, the second dome 114 may be cooled by flowing a coolant fluid between the second dome 114 and the metal member 150 or the housing 145.

Figure 1B:
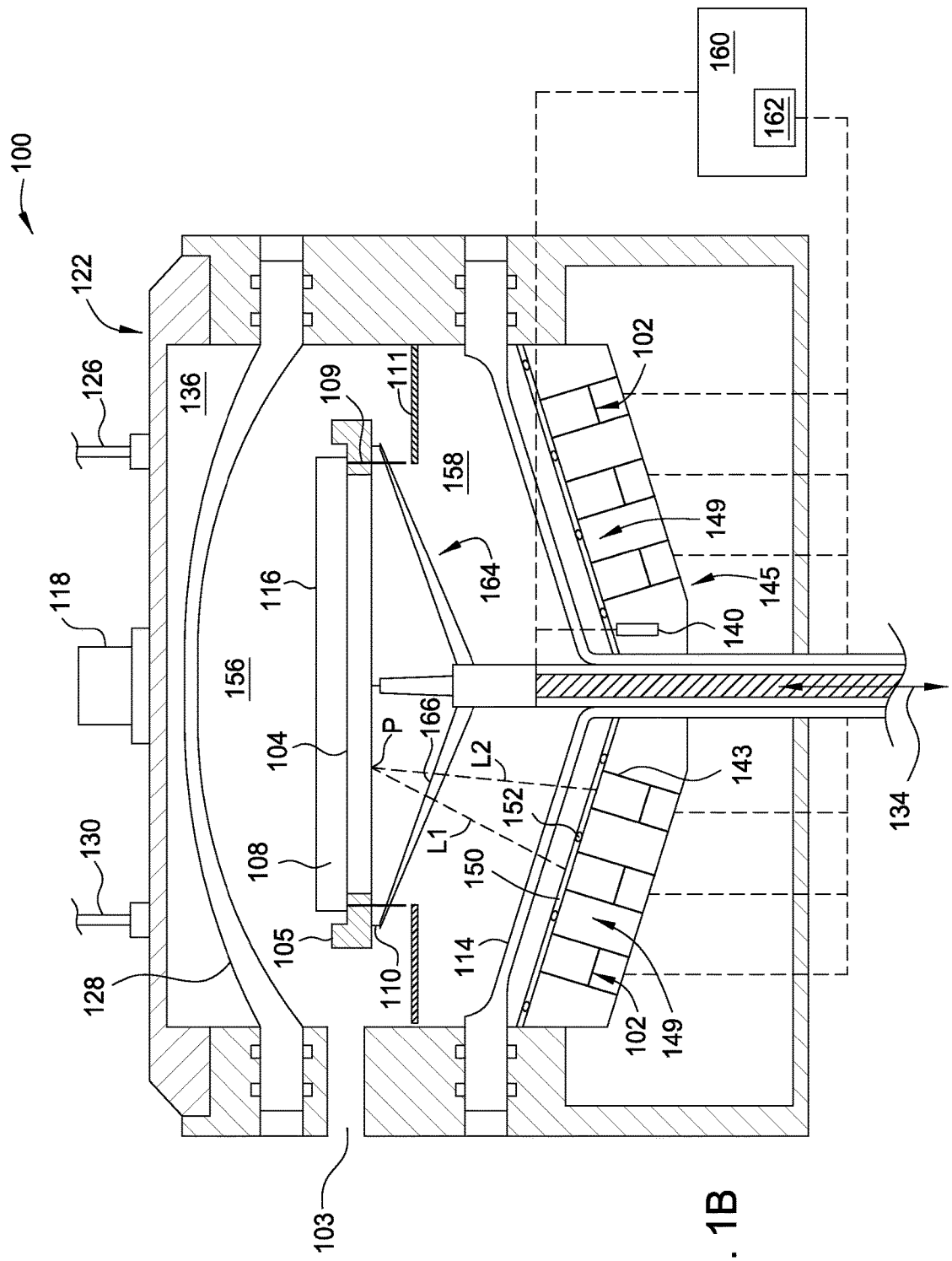

FIG. 1B is a schematic cross-sectional view of the process chamber 100 according to one embodiment described herein. Instead of the funnel-like substrate support 107, the processing chamber 100 includes a substrate support 164 that has a plurality of spokes 166. The pins 110 are supported by the spokes 166, and the pins either support the substrate 108 directly or via the edge ring 105. The spokes 166 may be made of an optically transparent material, such as quartz. During operation, the spokes 166 may be rotating and shadows may be formed on the back side of the substrate 108 as a result. To minimize the shadowing effect, the collimated energy source 102, such as a plurality of lasers, may be arranged so any area P on the back side 104 of the substrate 108 is illuminated by at least two laser beams, such as beams L1 and L2. In one embodiment, each area P on the back side 104 of the substrate 108 is illuminated by 10 laser beams.

Figure 1C:
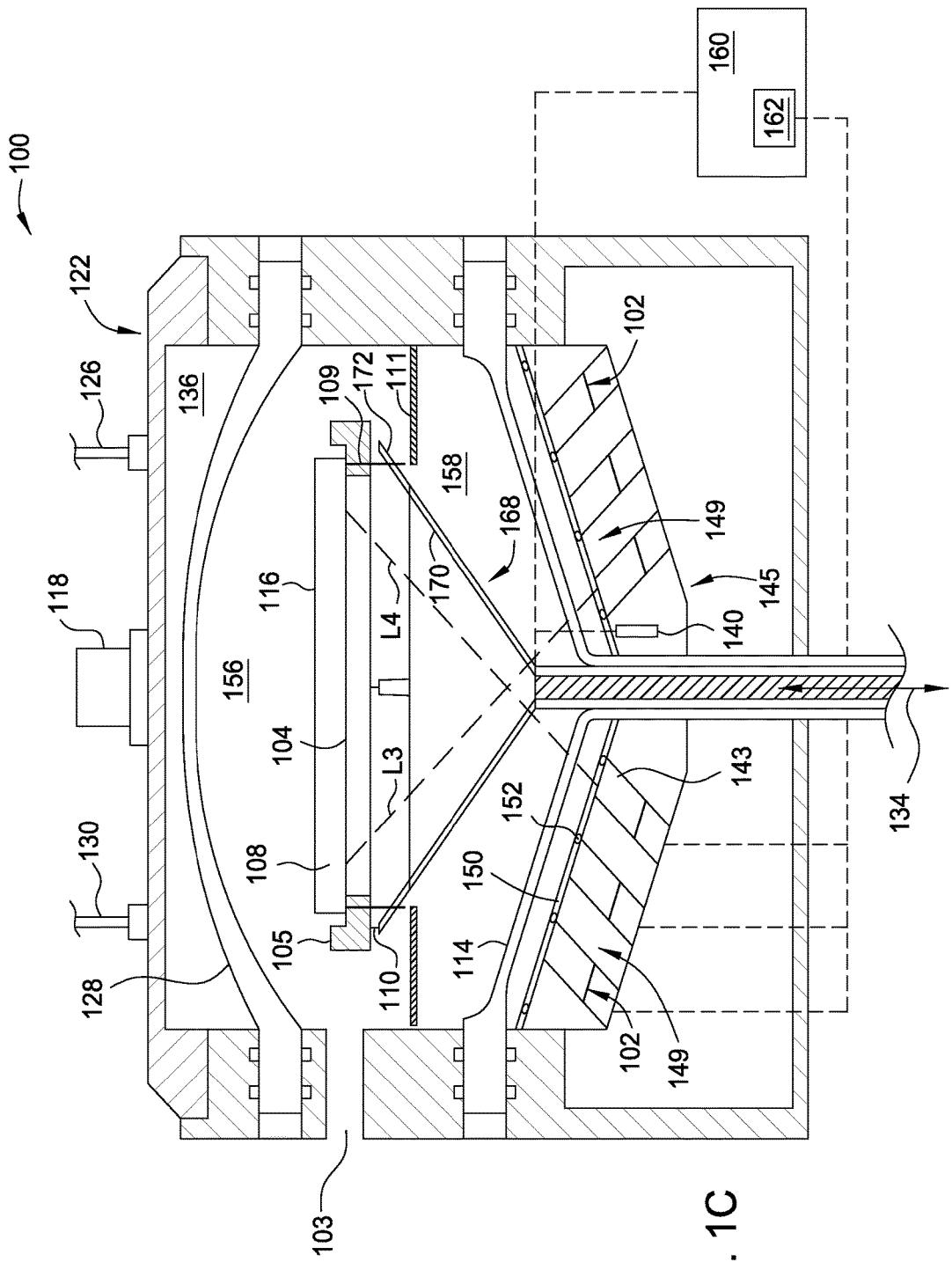

FIG. 1C is a schematic cross-sectional view of the process chamber 100 according to one embodiment described herein. The processing chamber 100 includes a substrate support 168 that has a funnel-like portion 170 and a plurality of spokes 172 extending radially outward from the funnel-like portion 170. The funnel-like portion 170 and the spokes 172 may be made of an optically transparent material, such as quartz. During operation, all the laser beams may be passing through the optically transparent funnel-like portion 170, and the beams may be delivered to the back side 104 of the substrate 108 at an angle, as shown in FIG. 1C as L3 and L4, so that the rotating spokes 172 do not form shadows on the back side 104 of the substrate 108.

Figure 1D:
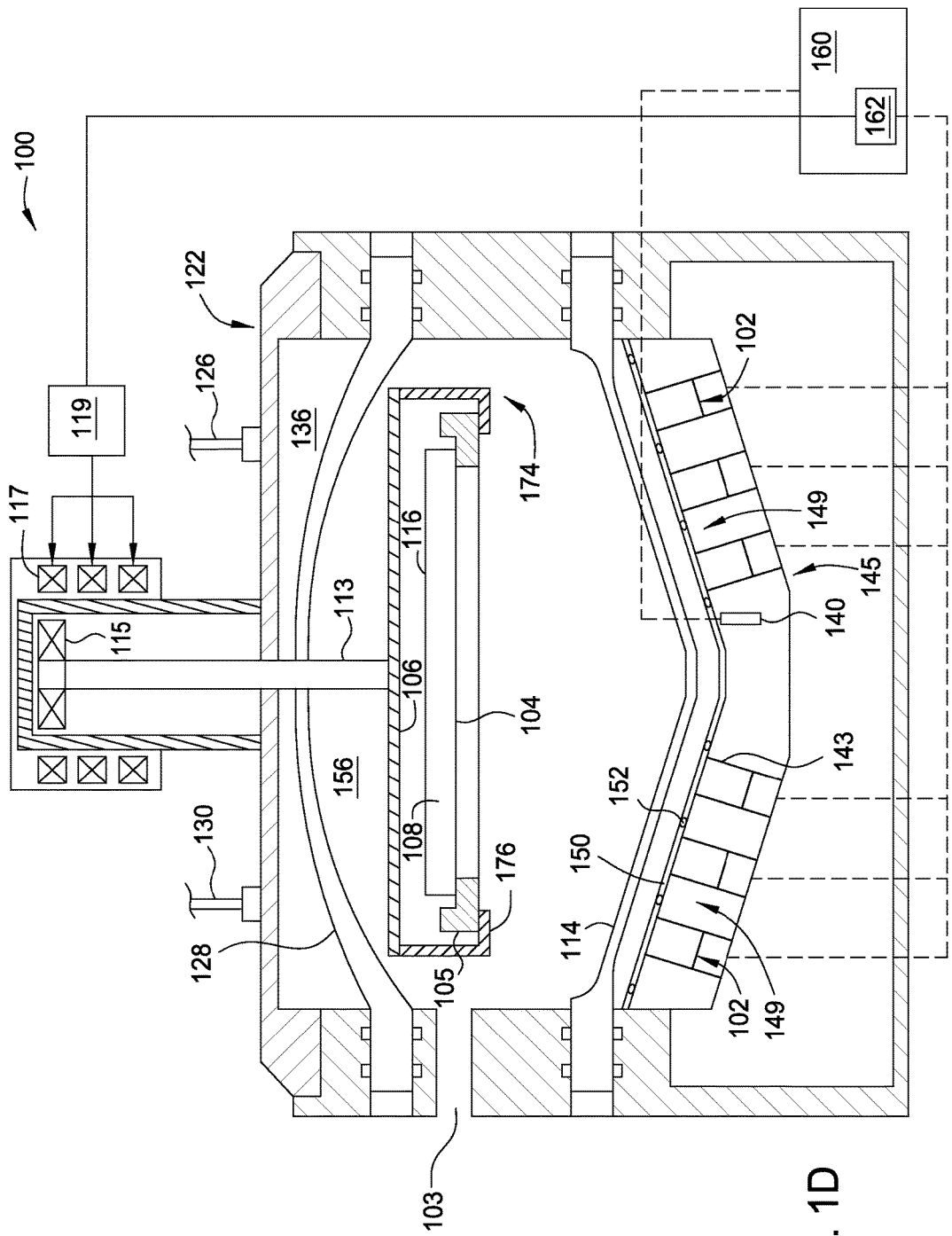

FIG. 1D is a schematic cross-sectional view of the process chamber 100 according to one embodiment described herein. The processing chamber 100 includes a substrate support 174 that is coupled to a disk 106. The substrate support 174 may include a plurality of brackets 176. In one embodiment, there are three brackets 176 supporting the edge ring 105. In this configuration, the substrate 108 may be removed from or introduced into the chamber 100 by a robot (not shown) through the loading port 103. The robot may be capable of generating a force, for example a Bernoulli force or gas float force, to lift the substrate 108 off the edge ring 105 without contacting the substrate 108. The disk 106 is coupled to a shaft 113 extending through the first dome 128 and the reflector 122. The shaft 113 may be capable of rotating or moving vertically by permanent magnets 115 and electromagnets 117. During operation, the electromagnets 117 are magnetically coupled to the permanent magnets 115 to move the permanent magnets 115. The electromagnets 117 are controlled by a drive controller 119 configured to generate and control magnetic fields in the electromagnets 117. The magnetic fields of the electromagnets 117 interact with the permanent magnets 115 to move the permanent magnets 115 vertically and/or rotate the permanent magnets 115, which in turn causing the edge ring 105 and the substrate 108 to move vertically and/or rotate.

Figure 2:
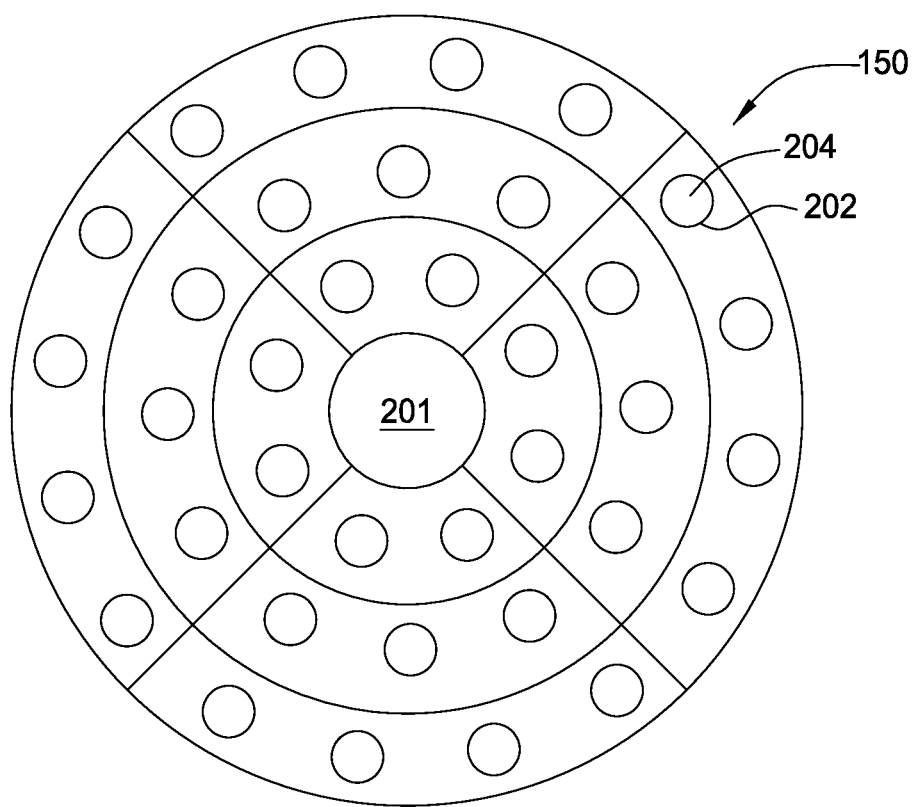
FIG. 2 is a plan view of a metal plate disposed between a lower dome and a collimated energy source according to one embodiment described herein.

FIG. 2 is a plan view of the metal member 150 according to one embodiment. The member 150 may have the same shape as the substrate 108, such as circular, as shown in FIG. 2. The member 150 maybe made of a metal, such as copper, aluminum or stainless steel. An opening 201 may be formed in the center of the member 150 for the central shaft 132 to go through. A plurality of apertures 202 may be formed in the member 150, and each aperture 202 is aligned with a laser or other emitter. Optical components 204, such as diffractive, refractive and/or reflective elements such as lenses, diffusers, shapers, truncators, and/or homogenizers, may be formed inside each aperture 202 to shape, focus or diffuse the energy to achieve uniform heating of the substrate 108. In one embodiment, the collimated energy source 102 is disposed inside the aperture 202. In other embodiments, the optical components 204 may be incorporated in the substrate support 107.

Figure 3:
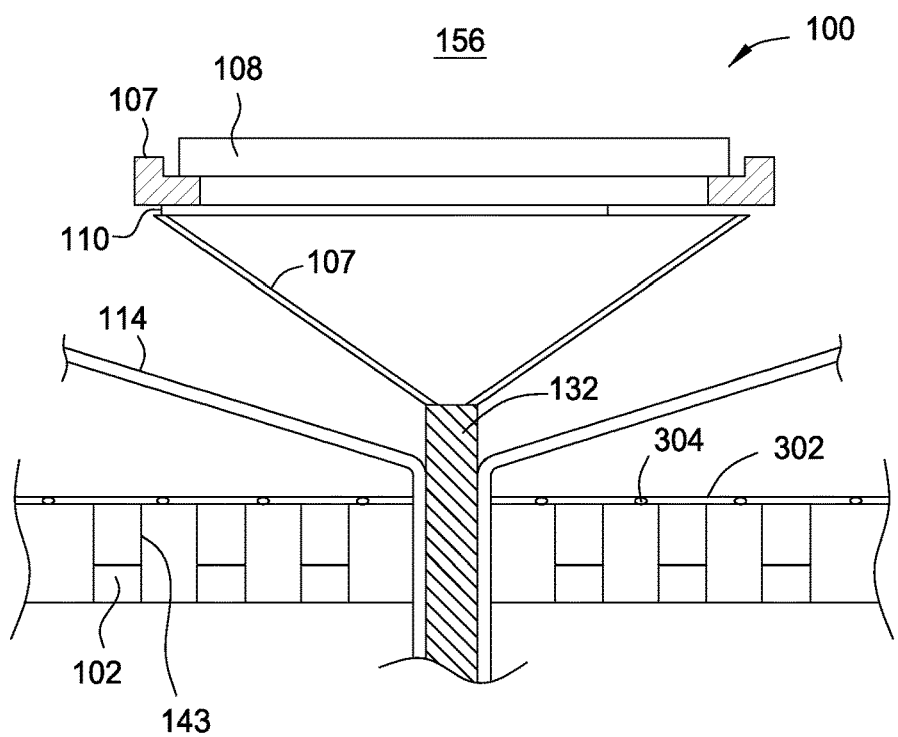
FIG. 3 is a schematic cross-sectional view of a portion of the process chamber according to one embodiment described herein.

FIG. 3 is a cross-sectional view of a portion of the process chamber 100. As shown in FIG. 3, a metal member 302 is disposed between the second dome 114 and the collimated energy source 102. The metal member 302 may be the same as the metal member 150, except that the metal member 302 is flat instead of conical. The metal member 302 includes a cooling channel 304 for flowing a coolant therethrough to control the temperature of the second dome 114. The metal member 302 also includes a plurality of apertures for laser beams to pass through and one or more optical components may be disposed inside each aperture.

Figure 4:
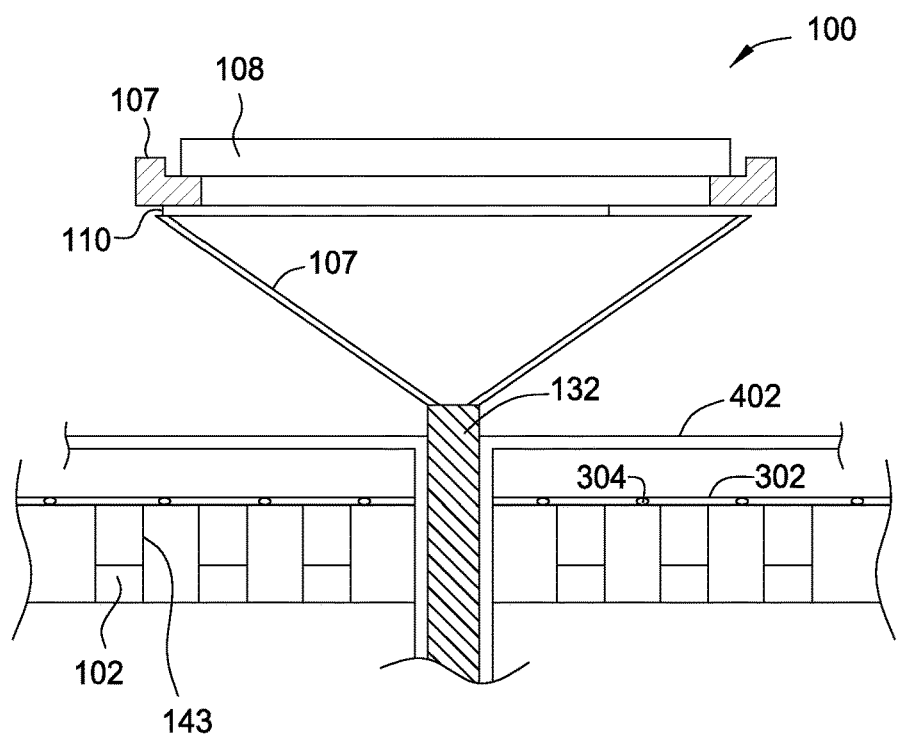
FIG. 4 is a schematic cross-sectional view of a portion of the process chamber according to one embodiment described herein.

FIG. 4 is a cross-sectional view of a portion of the process chamber 100 according to one embodiment. As shown in FIG. 4, a substantially flat dome 402 is disposed between the substrate support 107 and the collimated energy source 102. To be able to withstand the vacuum condition inside the process chamber 100, the flat dome 402 may be made of a metal such as aluminum. A liner (not shown) may be disposed on the flat dome 402 to protect the metal dome 402 from chemical erosion. The flat dome 402 may have a plurality of holes disposed therein for allowing laser beams to pass through. An optically transparent material, such as quartz, may be placed inside the holes to maintain vacuum condition and to allow laser beams to pass through. Thus, at least a portion of the flat dome 402 is optically transparent to the collimated energy of the collimated energy source 102. The collimated energy source 102 may form a plane that is substantially parallel to the flat dome 402.

Figure 5A:
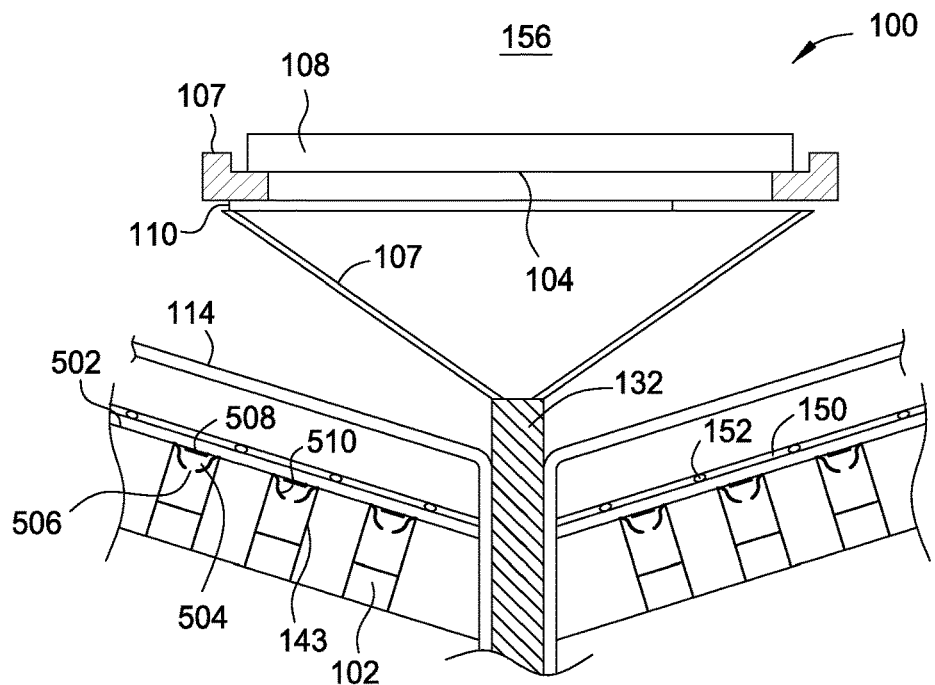
FIGS. 5A-5C are schematic cross-sectional views of a portion of the process chamber according to various embodiment described herein.

FIG. 5A is a schematic cross-sectional view of a portion of the process chamber 100 according to one embodiment described herein. A reflector 502 may be disposed over the collimated energy source 102. The reflector 502 may be disposed between the collimated energy source 102 and the metal member 150, or between the metal member 150 and the second dome 114. The reflector 502 may include a plurality of cavities 504, and each cavity 504 may be defined by a reflective surface 510 disposed in the tubing 143 above the collimated energy source 102. An opening 506 may be formed in each reflective surface 510 for the collimated energy to pass through. A mirror 508 may be disposed at the opening of the cavity 504 for reflecting the collimated energy to the reflective surface 510, which in turn reflects the collimated energy towards the back side 104 of the substrate 108. The reflective surface 510 may be an arc, curved segments, or linear sections, and may have facets in both length and width dimensions of the surface 510. The mirror 508 may be faceted, diffusive or a combination thereof. The reflector 502 may be a plurality of concentric rings or a plurality of concentric polygons.

Figure 5B:
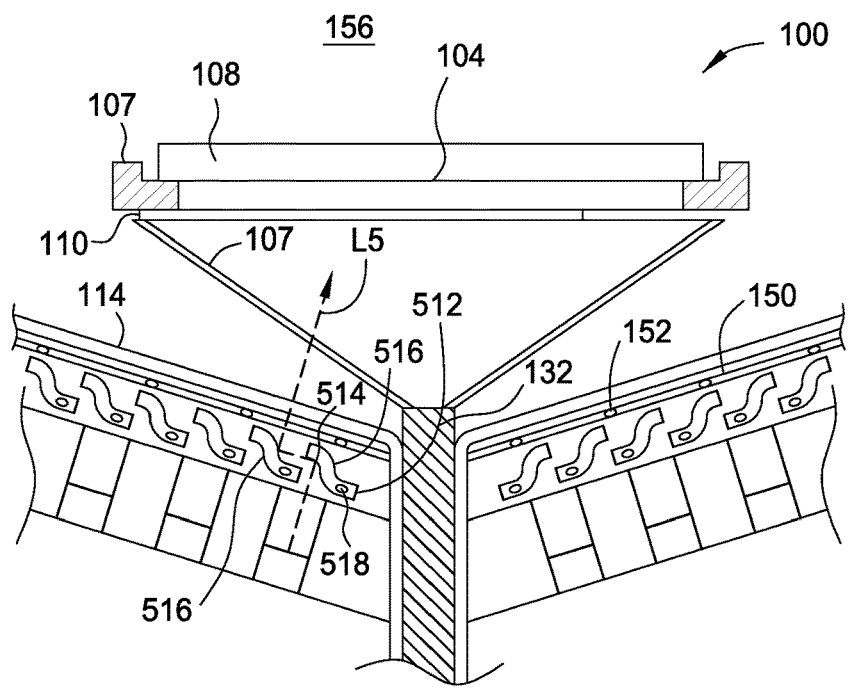

FIG. 5B is a schematic cross-sectional view of a portion of the process chamber 100 according to one embodiment described herein. A plurality of reflector rings 512 may be disposed over the collimated energy source 102. The reflector rings 512 may be disposed between the collimated energy source 102 and the metal member 150, or between the metal member 150 and the second dome 114. Each reflector ring 512 has a first reflective surface 514 and a second reflective surface 516. During operation, the collimated energy, indicated as "L5" in FIG. 5B, is reflected from the first reflective surface 514 of a first reflector ring 512 to the second reflective surface 516 of a second reflector ring 512 adjacent to the first reflector ring 512, and the second reflective surface 516 reflects the collimated energy source towards the backside 104 of the substrate 108. Each reflector ring 512 may include a channel 518 for a coolant to pass through.

Figure 5C:
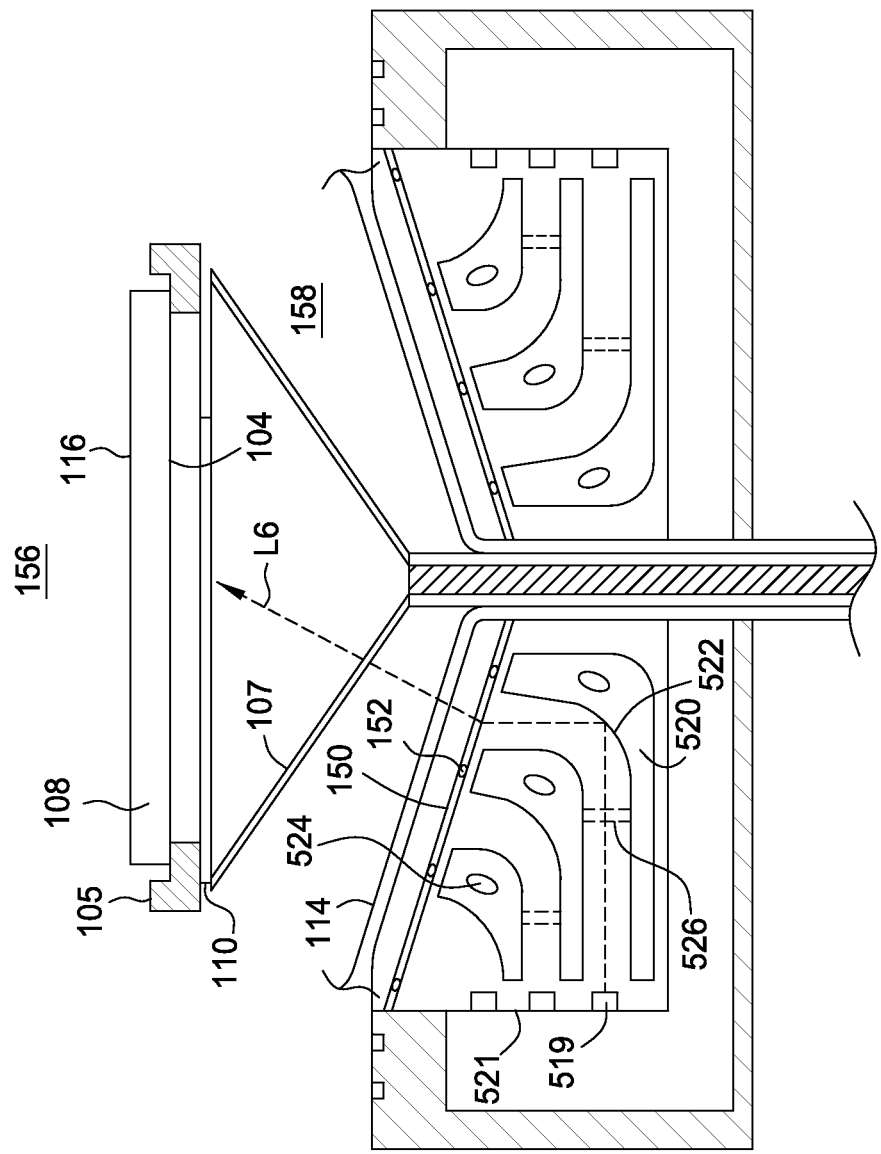

FIG. 5C is a schematic cross-sectional view of a portion of the process chamber 100 according to one embodiment described herein. A collimated energy source 519, such as a plurality of laser diodes, may be disposed on a surface 521 below the second dome 114. The surface 521 may be substantially perpendicular to the back side 104 of the substrate 108. A plurality of reflector rings 520 may be disposed below the second dome 114. In one embodiment, both the collimated energy source 519 and the rings 520 are disposed below the metal member 150. Each reflector ring 520 may have a reflective surface 522 that reflects the collimated energy, indicated as "L6" in FIG. 5C, from the collimated energy source 519 towards the back side 104 of the substrate 108. Each reflector ring 520 may include a channel 524 for a coolant to pass through. A support 526 may be used to support each reflector ring 520 and the support 526 may be out of the path of the collimated energy from the collimated energy source 519. For example, the support 526 may be disposed between the optical paths of two collimated energy sources 519 so no collimated energy is interrupted by the support 526.

Figure 6:
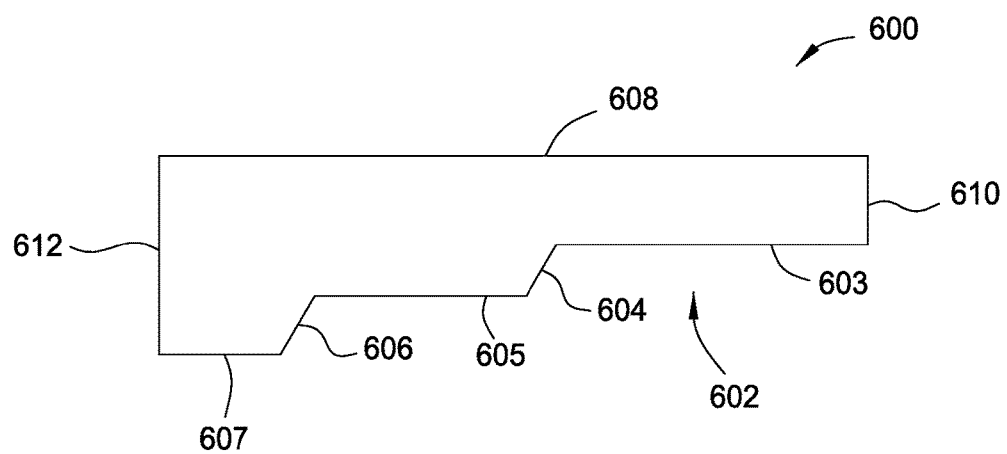
FIG. 6 is a side view of a refractor according to one embodiment described herein.

FIG. 6 is a side view of a refractor 600 according to one embodiment described herein. The refractor 600 may include a first surface 602, a second surface 608, a third surface 610 and a fourth surface 612. The first surface 602 may be non-linear and includes one or more slanted surfaces 604, 606, which are slanted with respect to the remaining surfaces 603, 605, 607 of the first surface 602 and to the third surface 610 and the fourth surface 612. The remaining surfaces 603, 605, 607 may be substantially parallel to the second surface 608, and the third surface 610 may be substantially parallel to the fourth surface 612. A plurality of refractors 600 may be disposed above the collimated energy source 102 and below the second dome 114 in order to control the direction of the collimated energy. The one or more slanted surfaces 604, 606 may be plain or textured. During operation, the collimated energy may enter from the surfaces 602 and/or 612, and the textured and/or plain surfaces 604, 606 causes the energy to exit through the second surface 608 and/or 610. The slope and texture of the slanted surfaces 604, 606 may vary in order to control the direction of the collimated energy exiting the refractor 600. Other types of refractors, such as holographic (diffraction) lenses, faceted surface lenses, or curved surface lenses, may be disposed between the collimated energy source 102 and the second dome 114 to control the direction of the collimated energy.

In summary, a collimated energy source that produces monochromatic light is utilized in a deposition process. The collimated energy source produces collimated light that creates multiple and spatially smaller zones of control on the substrate, which in turn provides better temperature control of the substrate. In addition, the collimated energy is monochromatic which enables more accurate temperature measurement.

While the foregoing is directed to implementations of the present invention, other and further implementations of the invention may be devised without departing from the basic scope thereof, and the scope thereof is determined by the claims that follow.

The invention claimed is:

1. A substrate processing apparatus, comprising:
a vacuum chamber comprising a first dome and a second dome;
a substrate support disposed inside the vacuum chamber between the first dome and the second dome and facing the first dome, wherein the substrate support has a substrate supporting surface;
a compartmented housing positioned proximate the second dome of the vacuum chamber;
a collimated energy source disposed in the compartmented housing, wherein at least a portion of the second dome and the substrate support are optically transparent to collimated energy from the collimated energy source;
a metal member disposed between the second dome of the vacuum chamber and the collimated energy source, wherein the metal member is spaced apart from the compartmented housing and includes a plurality of apertures; and
a reflector for directing collimated energy from the collimated energy source through the plurality of apertures in the metal member.

2. The substrate processing apparatus of claim 1, wherein the second dome is conical.

3. The substrate processing apparatus of claim 2, wherein the second dome and the substrate support are made of quartz.

4. The substrate processing apparatus of claim 3, wherein the collimated energy source is substantially conformal to the second dome.

5. The substrate processing apparatus of claim 4, wherein the plurality of lasers comprises laser diodes, fiber lasers or fiber coupled lasers.

6. The substrate processing apparatus of claim 3, wherein the collimated energy source is substantially parallel to the substrate supporting surface.

7. The substrate processing apparatus of claim 1, wherein the collimated energy source comprises a plurality of lasers.

8. A substrate processing apparatus, comprising:
a vacuum chamber comprising a first dome and a second dome;
a substrate support disposed inside the vacuum chamber between the first dome and the second dome and facing the first dome, wherein the substrate support has a substrate supporting surface;
a collimated energy source disposed on a surface below the second dome, wherein the surface is substantially perpendicular to the substrate supporting surface; and
a metal member disposed between the second dome of the vacuum chamber and the collimated energy source, wherein the metal member is spaced apart and distinct from the surface.

9. The substrate processing apparatus of claim 8, wherein the metal member is conformal to the second dome.

10. The substrate processing apparatus of claim 8, wherein the collimated energy source comprises a plurality of lasers.

11. The substrate processing apparatus of claim 10, wherein the plurality of lasers comprises laser diodes, fiber lasers or fiber coupled lasers.

12. The substrate processing apparatus of claim 8, wherein the metal member comprises a plurality of holes.

13. The substrate processing apparatus of claim 12, wherein one or more optical components are disposed inside each hole of the plurality of holes.

14. The substrate processing apparatus of claim 13, wherein one or more optical components comprises lenses, diffusers, and/or homogenizers.

15. A substrate processing apparatus, comprising:
a vacuum chamber comprising a first dome and a second dome;
a substrate support disposed inside the vacuum chamber between the first dome and the second dome and facing the first dome;
a compartmented housing positioned proximate the second dome of the vacuum chamber;
a collimated energy source disposed in the compartmented housing;
a reflector disposed between the compartmented housing and the second dome; and
a metal member disposed between the reflector and the second dome, wherein the metal member is spaced apart from the compartmented housing, and wherein the reflector is disposed between the metal member and the collimated energy source.

16. The substrate processing apparatus of claim 15, wherein the reflector comprises a plurality of reflector rings and each ring includes two reflective surfaces.

17. The substrate processing apparatus of claim 15, further comprising a plurality of refractors disposed between the collimated energy source and the second dome.

18. The substrate processing apparatus of claim 17, wherein each refractor of the plurality of refractors includes a first surface, a second surface, a third surface and a fourth surface, wherein the first surface includes one or more slanted surfaces.

19. The substrate processing apparatus of claim 15, wherein the substrate support is coupled to a shaft extending through the first dome.

* * * * *